United States Patent
Aubauer et al.

(10) Patent No.: US 8,823,393 B2
(45) Date of Patent: Sep. 2, 2014

(54) DEVICE AND PROCESS FOR TOUCH AND PROXIMITY DETECTION

(75) Inventors: Roland Aubauer, Wessling (DE); Hans Schwaiger, Munich (DE)

(73) Assignee: Ident Technology AG, Wessling (DE)

( * ) Notice: Subject to any disclaimer, the term of this patent is extended or adjusted under 35 U.S.C. 154(b) by 179 days.

(21) Appl. No.: 12/601,880

(22) PCT Filed: Sep. 29, 2009

(86) PCT No.: PCT/EP2009/062649
§ 371 (c)(1),
(2), (4) Date: Dec. 10, 2009

(87) PCT Pub. No.: WO2010/037758
PCT Pub. Date: Apr. 8, 2010

(65) Prior Publication Data
US 2011/0169506 A1    Jul. 14, 2011

(30) Foreign Application Priority Data

| Oct. 1, 2008 | (DE) | .......................... 10 2008 050 181 |
| Oct. 1, 2008 | (DE) | .......................... 10 2008 050 186 |
| Oct. 1, 2008 | (DE) | .................... 20 2008 013 083 U |
| Oct. 20, 2008 | (DE) | .......................... 10 2008 052 324 |

(51) Int. Cl.
*G01R 27/26* (2006.01)
*H03K 17/955* (2006.01)
*F24C 7/08* (2006.01)
*H03K 17/96* (2006.01)
*F24C 15/10* (2006.01)

(52) U.S. Cl.
CPC ............ *H03K 17/962* (2013.01); *H03K 17/955* (2013.01); *F24C 7/082* (2013.01); *H03K 2217/94089* (2013.01); *H03K 2217/96073* (2013.01); *F24C 7/086* (2013.01); *H03K 2217/96077* (2013.01); *H03K 2217/960705* (2013.01); *F24C 15/102* (2013.01); *H03K 2217/960765* (2013.01)
USPC ........... 324/658; 324/660; 324/661; 324/663; 324/668; 345/184; 431/66

(58) Field of Classification Search
CPC  G06F 3/03547; G01R 27/2605; G01R 27/26; G01R 27/04
USPC .................................................. 324/658–690
See application file for complete search history.

(56) References Cited

U.S. PATENT DOCUMENTS

| 5,231,359 | A | * | 7/1993 | Masuda et al. ................ 324/675 |
| 6,838,785 | B2 | | 1/2005 | Schilling ....................... 307/104 |
| 2009/0009491 | A1 | * | 1/2009 | Grivna .......................... 345/184 |

FOREIGN PATENT DOCUMENTS

| DE | 10131243 C1 | 11/2002 | ............ G01V 3/08 |
| EP | 0565976 A1 | 10/1993 | ............ G05B 19/10 |
| EP | 1349281 A2 | 10/2003 | ............ F24C 15/00 |
| GB | 1529862 A | * 1/1975 | ............ H03K 17/00 |

OTHER PUBLICATIONS

International Search Report and Written Opinion, Application No. PCT/EP2009/062649, 18 pages, Mar. 3, 2010.

* cited by examiner

*Primary Examiner* — Arleen M Vazquez
*Assistant Examiner* — Son Le
(74) *Attorney, Agent, or Firm* — King & Spalding L.L.P.

(57) ABSTRACT

The invention relates to a device for touch/proximity detection, especially a capacitive switch device, which is designed to set switching states by approaching the switch device or by touching the switch device, in order to perform, for example, switching actions on an instrument. The invention also relates to a switch device, especially a switch device on a capacitive basis, for a cooktop, for operating the cooktop.

22 Claims, 10 Drawing Sheets

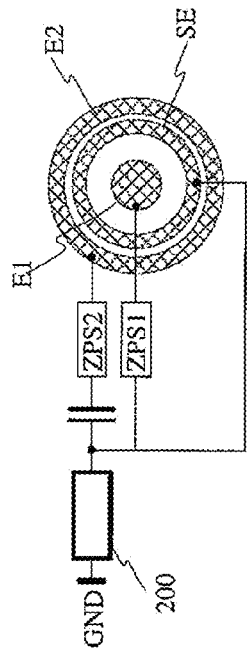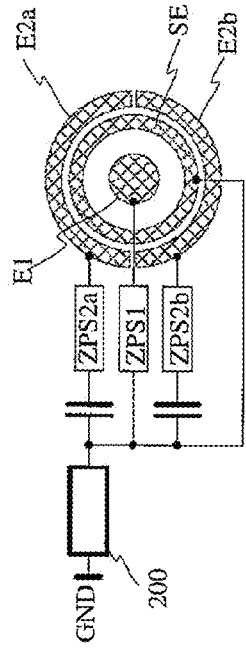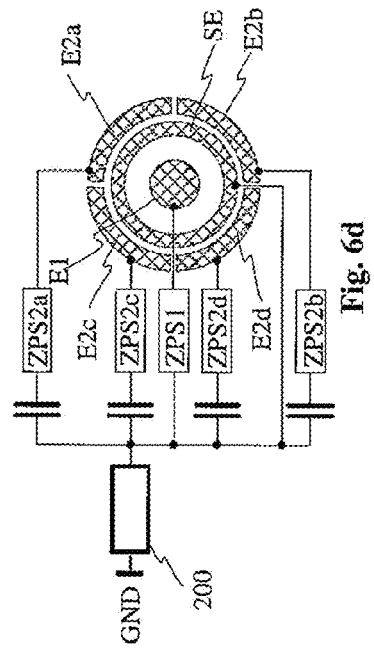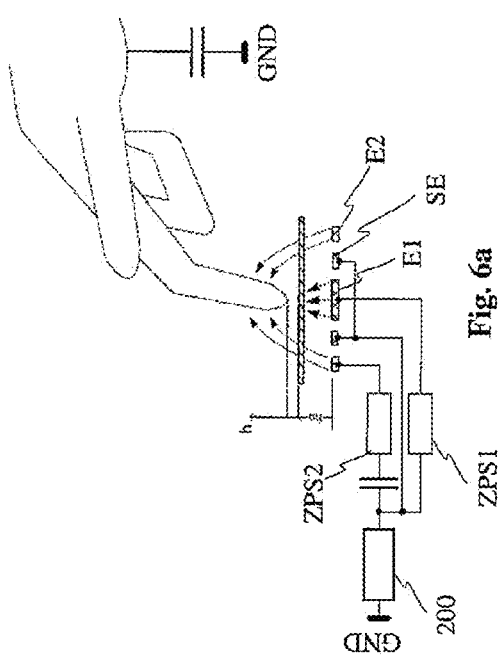

DEVICE AND PROCESS FOR TOUCH AND PROXIMITY DETECTION

CROSS REFERENCE TO RELATED APPLICATIONS

This application is the US national phase of PCT application PCT/EP2009/062649, filed 29 Sep 2009, published as 102008052324.0, and claiming the priority of German patent application 102008050181.6itself filed 1 Oct 2008 and German patent application 102008050186.7 itself filed 1 Oct 2008, whose entire disclosures are herewith incorporated by reference.

FIELD OF THE INVENTION

The invention relates to a device for touch/proximity detection, especially to a capacitive switch device, which adjusts switching states by approaching the switch device or by touching the switch device, in order to perform, for example, switching actions on an instrument.

The invention also relates to a switch device, especially a switch device on a capacitive basis, for a cooktop for operating the cooktop.

STATE OF THE ART

Capacitive switches are known in various types from prior art. In order to adjust a switching state, it is known to set a fixed level specific for the use as a switching threshold, which forms in case of approach or touch of the top surface of the capacitive switch device. When exceeding or falling below this switching threshold, a switching process is triggered, for example in a household appliance.

Here the disadvantage is, however, that by coupling fluctuations of the capacitive coupling, for example between the finger and the capacitive switch, the signal levels of the capacitive switches oscillate and reaching the switching threshold cannot be always ensured. The coupling fluctuations may be for example based on changing mass reference of Man or be due to environmental influences.

Another disadvantage consists of the fact that when mounting a capacitive switch behind a control panel, for example a glass sheet, a distinction between approach and touch is no longer possible.

Capacitive switch devices for cooktops, especially for glass ceramic cooktops, are known from prior art. Capacitive switch devices are arranged for example in case of glass ceramic cooktops at the bottom of the glass ceramic plate. An approach to the capacitive switch devices arranged under the glass ceramic plate causes the switching of a function according to the switching function assigned to the respective switch device. The capacitive switch devices known from prior art present detector electrodes, at which an electric field is emitted. An approach to the detector electrode causes an at least partial absorption of the electric field. The change of the electric field is detected with an evaluating device, to which the detector electrode is connected.

In case of several capacitive switch devices arranged below the glass ceramic plate, for every capacitive switch device there is a corresponding evaluation unit or a common evaluation unit, to which all detector electrodes are connected. The detector electrodes are either connected with the evaluation unit by means of cables, or mounted together with the evaluation unit on a connected printed circuit. The size and geometry of such a printed circuit depends on the arrangement and number of the switching functions needed for the cooktop. For different variants of a cooktop thus different logic board cards have to be provided.

OBJECT OF THE INVENTION

Therefore, it is an object of the invention to provide a capacitive switch or a capacitive switch device, especially for a cooktop, in which on the one hand reaching a predetermined switching threshold can be ensured independently of coupling fluctuations of the capacitive coupling between the operator and the capacitive switch device and on the other hand a clear distinction is possible between an approach and a touch, and which can be integrated in a simple way into the cooktop.

SOLUTION ACCORDING TO THE INVENTION

According to this, a device for the touch/proximity detection is provided, which comprises an electrode structure with at least one detector electrode E1 and at least one auxiliary electrode E2 arranged at a predetermined distance from the detector electrode E1, modulation means, and at least one detection means, wherein the at least one detector electrode E1 by means of the modulation means may be coupled with the detection means, and wherein the detection means may detect capacitive couplings between the electrode structure and an object.

In an advantageous embodiment of the invention an arrangement for the touch/proximity detection is provided, which comprises an electrode structure with at least one first electrode and one second electrode, wherein the first electrode and the second electrode may be coupled with a detection means and wherein the detection means is designed for detecting indicative signals of capacitive couplings between the electrodes and an object, and wherein the surfaces of the first electrode and the second electrode as well as the arrangement of the first electrode and the second electrode towards each other are selected in such a way that in case of approach to the electrode structure of the object up to a predetermined distance the quotient between a signal level of the signal indicative of the capacitive coupling C2 and a signal level of the signal indicative of the capacitive coupling C1 is greater than 1.

In this way advantageously a definite switching point may be determined.

The modulation means may include at least two modulation devices, wherein the modulation devices each time may be capacitively coupled with the detection means and in which each time an electrode may be coupled with a modulation device.

The modulation devices may be formed to modulate an electric variable of the modulation devices depending on the respective capacitive couplings between the electrodes and the object, wherein a modulation of the electric variable causes a change of the load at the detection means.

The modulation may include an amplitude modulation.

The modulation devices may include an oscillation circuit or a frequency divider.

Each of the modulation devices may be designed for causing an amplitude modulation of the electric variable indicative of the respective modulation device with a predetermined frequency.

In this way the signals indicative of the coupling capacitances may be separated. The modulation devices may have a coupling electrode, in which an electric field emitted by the detection means may be coupled to the coupling electrodes.

The first electrode is substantially circular and the second electrode is arranged substantially annularly around the first electrode.

Between the first electrode and the second electrode a shield electrode may be arranged.

The second electrode may include at least two electrode segments, in which each electrode segment may be coupled each time with a modulation device, and in which each of the modulation devices may be coupled capacitively with the detection means.

In a further advantageous embodiment of the invention an arrangement for the touch/proximity detection is provided, which comprises a detector electrode, an auxiliary electrode and a modulation device, which may be coupled with the detector electrode, wherein the detector electrode and the auxiliary electrode may be brought with each other into a capacitive coupling of a predetermined coupling capacitance C1, in which between the auxiliary electrode and an object a coupling capacitance C2 may be formed, which undergoes a change in case of approach of the object to the auxiliary electrode and/or at a touch of the auxiliary electrode by the object, wherein the coupling capacitance C1 and the coupling capacitance C2 form a total capacitance between the detector electrode and the object, and wherein the modulation device is designed for modulating an electric variable of the modulation device depending on the total capacitance between the detector electrode and the object.

It is advantageous that a touch/proximity switch may be covered by a control panel, ensuring nevertheless that an approach to the switch may be distinguished from a touch of the switch.

The arrangement for touch/proximity detection may have a detection means which is designed for detecting a variable that is indicative of the total capacitance between the detector electrode and the object.

The detection means may be capacitively coupled with the modulation device. That has the advantage that switch elements (detector electrode, auxiliary electrode and modulation device) are mounted independently of the detection means.

The modulation device may have a coupling-in electrode, wherein the capacitive coupling of the detection means with the modulation device may be produced by an electrical alternating field that may be emitted by the detection means and be coupled at the coupling-in electrode.

The modulation device may be supplied with energy with the electric alternating field. For the modulation device no internal power supply needs to be provided.

The modulation device may include an oscillation circuit or a frequency divider. The modulating of the electric variable may be an amplitude modulation.

The modulating of the electric variable of the modulation device may cause a change of the load at the detection means. The change of the load may be detected by the detection means.

It is advantageous if the auxiliary electrode is substantially parallel to and arranged at a predetermined distance from the detector electrode.

In an advantageous embodiment of the invention the touch of the auxiliary electrode by the object causes an abrupt rise in the total capacitance between the detector electrode and the object.

Moreover, a detection means is provided, which is designed for the cooperation with an arrangement according to the invention for touch/proximity detection, wherein the detection means comprises: an electric circuit for generating an electric field, which may be coupled with coupling electrodes of the arrangement for touch/proximity detection, and means for evaluating an electric variable, wherein the evaluation comprises a detection of a load change in the electric circuit.

The load change may include parts of different frequencies, wherein the evaluation comprises a separation of the parts with different frequency and wherein the detection means comprises means for generating a switching signal from the separate parts with different frequency.

The detection means may present means for forming direct components of the amplitudes of the separate parts with different frequency, wherein the means for generating a switching signal are designed in such a way that a level change of the switching signal occurs when the direct component of the one part exceeds or falls below the direct component of the other part.

The electric circuit may include: a LC resonant circuit with a signal generating circuit, preferably a high-quality LC resonant circuit, for generating the electric field; and a transmitting electrode switched in parallel to the LC resonant circuit, wherein the capacitance of the transmitting electrode constitutes a component of the oscillation circuit capacitance and in which the electric field generated by the LC resonant circuit may be emitted at the transmitting electrode.

Preferably the direct components of the amplitudes of the separate parts correspond to the capacitive couplings between the electrodes of the capacitive switch device and the object.

Also a switch panel is provided, which comprises at least one arrangement according to the invention for touch/proximity detection, wherein the auxiliary electrode is arranged at the user side of the switch panel and the detector electrode is arranged at the back side of the switch panel.

The arrangement of the auxiliary electrode and the detector electrode towards each other is selected in such a way that the detector electrode and the auxiliary electrode form a capacitive coupling with a predetermined coupling capacitance.

The invention also provides a switch device for a cooktop, which comprises a receiving device or a detection means and at least one control element, wherein the receiving device comprises an electrode device. In which the at least one control element comprises at least one first electrode and at least one second electrode, wherein the electrode device of the receiving device may be coupled capacitively with the at least one first electrode of the at least one control element, wherein the at least one second electrode of the at least one control element constitutes with earth a coupling capacitance, wherein an operation of the at least one control element may be transmitted capacitively to the receiving device, wherein a load of the receiving device corresponds to the coupling capacitance with earth of the at least one electrode of the at least one control element, and wherein the electrode device of the receiving device is formed by conductive structures of the cooktop arranged below the cooktop.

In this way a switch device is provided, which thanks to a particularly compact design and the capacitive coupling to the receiving device may be arranged in a simple and particularly space saving way below the cooktop.

In one embodiment the control element presents at least one modulation device, which is designed for modulating an electric variable of the control element depending on the change of the coupling capacitance of the electrode with earth.

Approaches to the switch device and/or touching the switch device may be detected in such a way by the receiving device.

The control element may be formed in such a way, that a change of the coupling capacitance of the electrode with earth causes a change of the load of the receiving device.

The change of the coupling capacitance of the electrode with earth may cause a modulation of an electric variable of the control element.

Preferably an electric field emitted by the receiving device may be coupled at least partially into the electrode, wherein the modulation of the electric variable causes a modulation of the load of the control element at the receiving device.

The modulation may include an amplitude modulation. The modulation device may include an oscillation circuit or a frequency divider. In this way several modulation devices may be distinguishable for the receiving device.

The modulation devices of the at least one control element may be designed to cause a frequency modulation indicative of the respective control element of the electric variable.

In one embodiment the receiving device may present: an electric circuit for generating an electric field, which is coupled into the electrode of the control element, in which the electric circuit may be coupled with the electrode device, and means for evaluating an electric variable.

The evaluation may include a detection of a load change in the electric circuit.

The load change may comprise at least one frequency-modulated part, wherein the evaluation comprises a separation of the frequency-modulated parts of the load change.

The at least one control element may be arranged preferably at the bottom of the cooktop in such a way that the second electrode is orientated towards the bottom of the cooktop.

At the upper side of the cooktop or below the top surface of the cooktop an auxiliary electrode may be arranged, wherein the arrangement of the auxiliary electrode is selected in such a way that it is capacitively coupled with the second electrode of the control element.

Finally, the invention provides a process for the production of a cooktop with an upper side and a bottom, in which at the bottom a structure with a predetermined number of capacitive circuit components is arrangeable, and in which control elements for the cooktop are generated, by applying conductive structures on the upper side of the cooktop in such a way that they may be brought into capacitive coupling with the respective circuit component.

A number of capacitive circuit components may be arranged in such a way at the bottom of a cooktop, wherein the activation of the single circuit components is done by applying a conductive structure at the top surface of the cooktop. The conductive structures are applied at the top surface in such a way that they are situated substantially exactly opposite the circuit components. By the capacitive coupling between the conductive structures and the respective circuit components the approach of the operator to a conductive structure may be detected by the corresponding capacitive circuit component. Circuit components, to which no conductive structure is assigned, may be deactivated in this way. In this way it is possible to provide unified structures of circuit components for different equipment variants of cooktops, wherein the activation is done by means of conductive structures at the top surface of the cooktop.

Arranging conductive structures at the top surface of the cooktop may take place for example by vapor coating. Preferably the conductive structures with the respective capacitive circuit components may be brought into capacitive coupling with a predetermined coupling capacitance.

The capacitive circuit components present at least one first electrode and at least one second electrode, wherein the capacitive circuit components have at least one modulation device, which is formed to modulate an electric variable of the respective capacitive circuit component depending on the change of the coupling capacitance of the respective conductive structures with earth, and wherein the second electrode may be brought into capacitive coupling with the respective conductive structure with a predetermined coupling capacitance. By the approach of the operator to the conductive structure an electric variable of the circuit component assigned to the conductive structure is modulated, preferably amplitude-modulated, wherein the amplitude of the modulation depends on the capacitive coupling between the operator and the conductive structure.

BRIEF DESCRIPTION OF THE FIGURES

Further advantageous embodiments of the invention result from the sub-claims in association with the drawing and the following description. The figures show:

FIG. 6a an embodiment of a capacitive switch device according to the invention with an additional screen electrode;

FIG. 6b -6d show an arrangement of two electrodes of a switch device, wherein an electrode may be formed by several electrode segments and in which between the two electrodes a screen electrode is arranged;

DETAILED DESCRIPTION OF THE INVENTION

Figure 1:
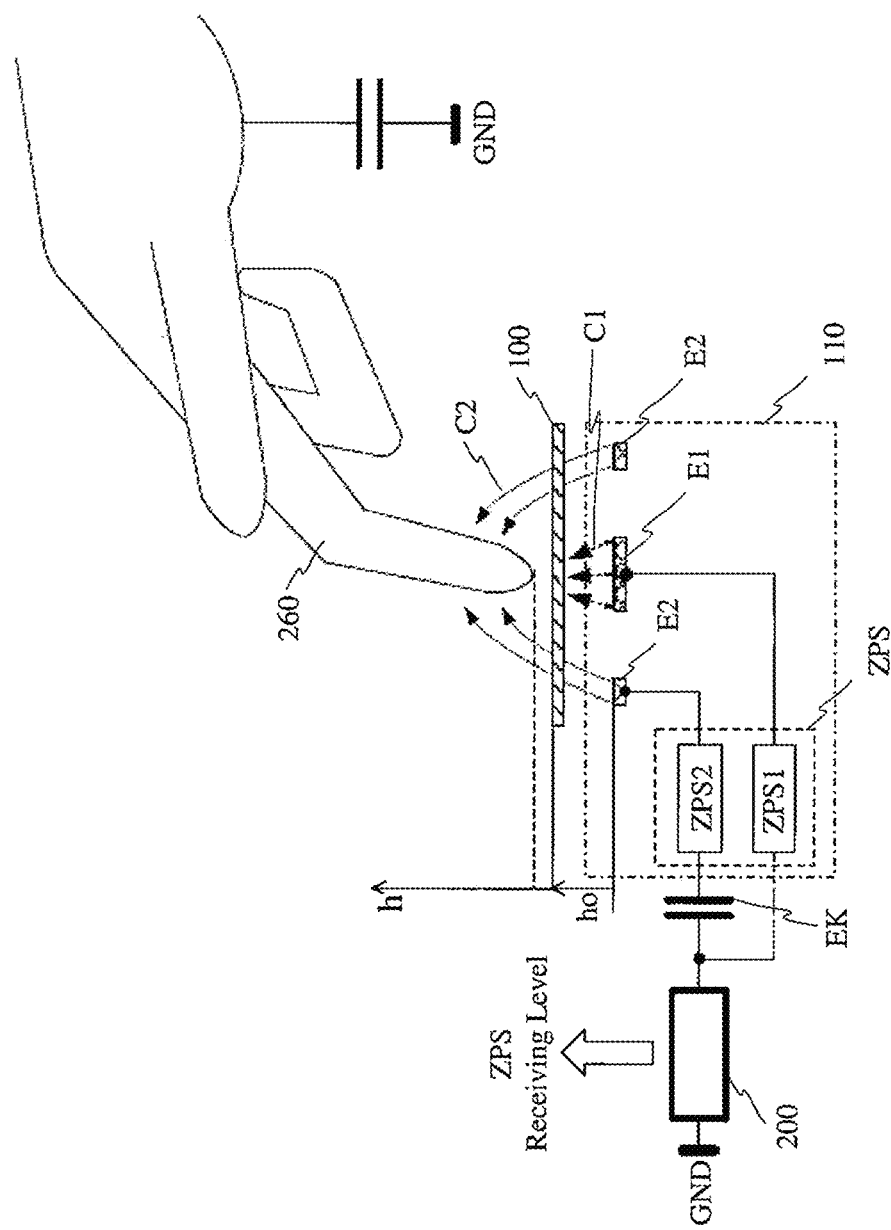
FIG. 1 an embodiment of a capacitive switch device according to the invention.

FIG. 1 shows an embodiment of the capacitive switch device according to the invention. The switch device comprises a detection means 200 and a switch element 110. The switch element 110 is formed of two electrodes E1 and E2, which each time are coupled with a modulation device ZPS1 and ZPS2. The two modulation devices ZPS1 and ZPS2 may be coupled either capacitively (like the modulation device ZSP2) or galvanically (like the modulation device ZSP1) with the detection means 200.

In case of a capacitive coupling of a modulation device with the detection means 200, the modulation device presents a coupling-in electrode EK, to which an electrical alternating field emitted by the detection means 200 may be coupled. With this electric alternating field, with a corresponding design of the modulation device, the latter is also supplied with energy.

By means of the coupled alternating electric field the load of the detection means 200 is modulated by the modulation device. In case of a galvanic coupling of the modulation device with the detection means 200, the load of the detection means is also modulated by the modulation device. This modulation is detectable by the detection means 200.

The structure and the operation of the detection means 200 as well as the interaction with the modulation devices is described in more detail below in regard to FIG. 5.

As visible in FIG. 1, each time one electrode E1, E2 is connected to each time one modulation device ZPS1, ZPS2. The approach of an object, for example of a finger 260, to the electrodes E1, E2 ensures that the coupling capacitances C1, C2 between the electrodes E1, E2 and the finger 260 change. The changes of this coupling capacitances ensure that also the modulation of the alternating electric field coupled to the coupling-in electrode EK changes. This change is detected again by the detection of the modulated load by the detection means 200.

Environmental influences on the capacitive coupling between the finger 260 and the electrodes E1, E2 affect both load modulations detected by the detection means 200 and have therefore no influence on the determination of the switching point of the capacitive switch.

In order to be able to identify a precise switching point, the electrodes E1 and E2 are arranged in such a way that in case of an approach of the finger 260 to the switch device at first the capacitive coupling C2 between the electrode E2 and the finger 260 is greater than the capacitive coupling C1 between the electrode E1 and the finger 260. This entails that, if the modulation devices ZPS1, ZPS2 amplitude-modulate the load of the detection means 200, the load of the detection means 200 is amplitude-modulated with each time different amplitudes.

In case of increasing approach of the finger 260 to the switch device, i.e. in case of decreasing distance between the finger 260 and the switch device, the capacitive coupling C1 between the electrode E1 and the finger 260 increases more than the capacitive coupling C2 between the electrode E2 and the finger 260.

This will allow that, in case of a certain distance of the finger 260 from the capacitive switch device, the capacitive couplings C1 and C2 between the electrodes E1 and E2 and the finger 260 are substantially equally high. This distance has the reference sign ho in FIG. 1.

Figure 3:
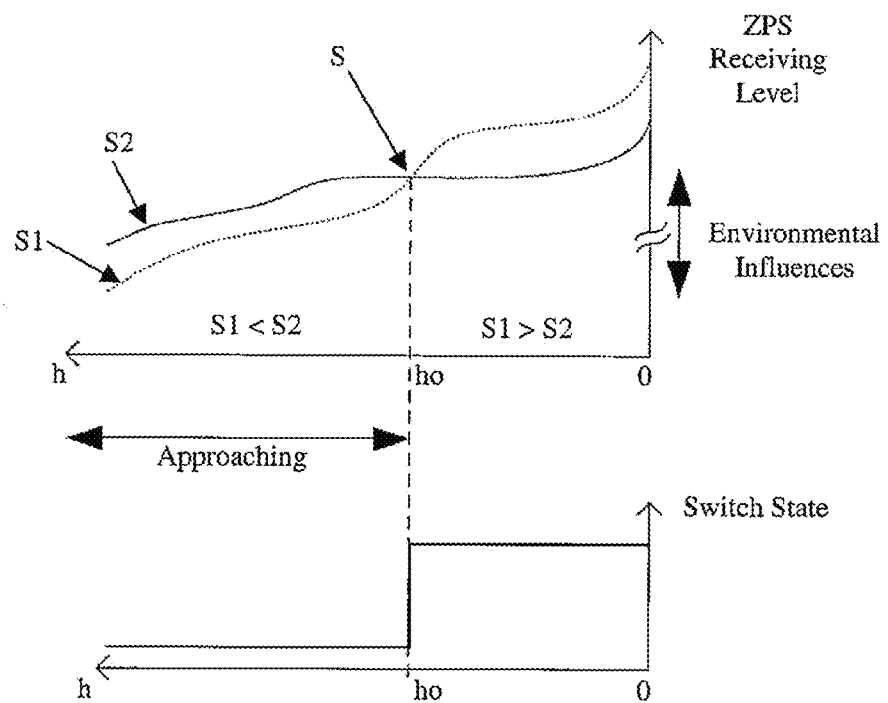
FIG. 3 the signal curves of two signals modulated by two modulation devices in a detection means.

In case of a still further approach of the finger 260 to the switch device finally the capacitive coupling C1 exceeds the capacitive coupling C2. The changes of the capacitive couplings C1, C2 in case of increasing approach of the finger 260 to the capacitive switch device also causes that the modulation devices assigned to the electrodes E1 and E2 ZPS1 and ZPS2 amplitude-modulate the coupled electric field with growing amplitudes. The modulation of the load caused by that in the detection means is detected by the detection means. The detection means 200 generates a signal for both electrodes E1 and E2, wherein the signal curves each time depend on the capacitive coupling C1 and C2 between the electrodes E1 and E2 and the finger 260. Such signal curves are shown in FIG. 3. The signal curve S1 shows the course of the load of the detection means modulated by the modulation device ZPS1.

The signal curve S2 shows the course of the load of the detection means modulated by the modulation device ZPS2. As can be seen in FIG. 3, both these signal curves S1 and S2 intersect in the point S. This point S substantially corresponds to that position of the finger 260 in which the capacitive couplings C1 and C2 are substantially equally high (in case of equal amplification of the signals).

In case of a further approach of the finger 260 to the switch device the level of the signal S1 exceeds the level of the signal S2. In this way the point S, in which both signals S1 and S2 intersect, may be identified definitely as switching level for the switch device. This is possible also in case of fluctuations of the coupling capacitances, as these fluctuations influence both signal curves equally.

In the lower area of FIG. 3 a switching level assigned to the signals S1 and S2 is shown, in which the switching state changes when the signal levels of the two signals S1 and S2 are substantially equal.

The progression of the coupling capacitances C1 and C2 in case of approaching finger 260 depends on the surfaces of the electrodes E1 and E2 as well as on the arrangement of the electrodes E1 and E2 towards each other. The arrangement of the electrodes E1 and E2 towards each other as well as the surfaces of both electrodes E1 and E2 are to be chosen in such a way, that in case of an approach of the finger up to a predetermined distance ho of the finger from the electrode device, as described above, the coupling capacitance C2 is greater than the coupling capacitance C1. Below this distance the coupling capacitance C1 is greater than the coupling capacitance C2.

In another embodiment the signals detected by the detection means may be amplified differently, so that the signals S1 and S2 no longer intersect in the point S when the coupling capacitance C1 corresponds to the coupling capacitance C2. In this case the surfaces of the two electrodes E1 and E2 as well as the arrangement of the electrodes E1 and E2 towards each other are selected in such a way that the signals S1 and S2 intersect in the point S in case of different coupling capacitances C1 and C2.

Figure 2:
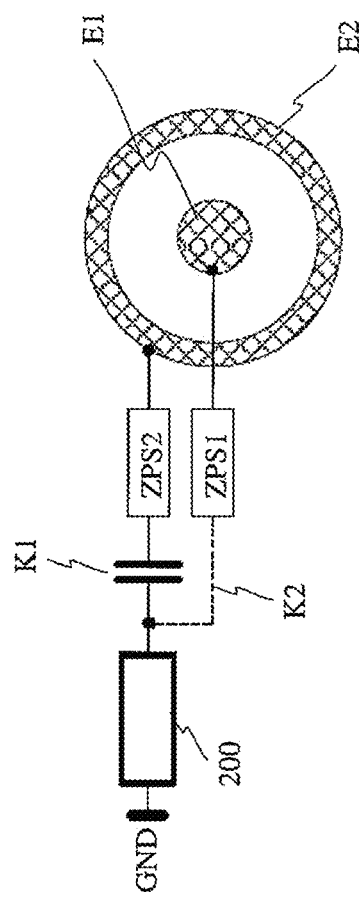
FIG. 2 an arrangement of two electrodes of a switch device, which are designed to generate a precise switching point.

FIG. 2 shows a possible embodiment of the electrodes E1 and E2 as well as their arrangement towards each other. The electrode E1 is substantially circular, whereas the electrode E2 is arranged around the electrode E1 substantially at a certain distance from the electrode E1. In this arrangement and embodiment of the electrodes E1 and E2, for example by changing the area of the electrode E1 the distance may be set, at which the coupling capacitance C1 becomes greater than the coupling capacitance C2. In the arrangement and embodiment of the electrodes E1 and E2 it must be borne in mind that an approach of a finger 260 entails that the coupling capacitance C1 starting from a certain distance of the finger from the switch device becomes greater than the coupling capacitance C2. Instead of the annular arranged electrodes E2 for example two ring segment shaped electrodes may be arranged around the electrode E1, wherein both ring segment shaped electrodes are coupled with the detection means 200 each time by means of one modulation device. In this way it is possible to unmistakably identify not only the switching point, but also the direction from which the approach is made.

As can be seen additionally in FIG. 2, the coupling of the modulation devices ZPS1 or ZPS2 with the detection means 200 may take place both galvanically (K2) and capacitively (K1).

Figure 4:
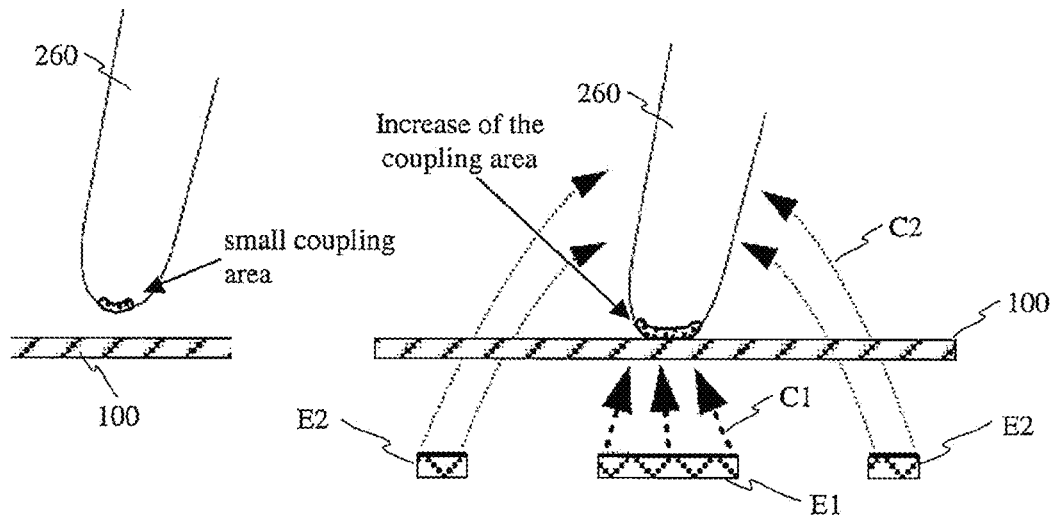
FIG. 4 the arrangement of two electrodes of a capacitive switch device behind a switch panel.

FIG. 4 shows another embodiment of a switch device according to the invention, in which the electrodes E1 and E2 of the switch device are arranged behind a control panel 100.

In case of arrangement of the electrodes E1 and E2 behind a control panel 100, the surfaces of the electrodes E1 and E2 or the arrangement of the electrodes E1 and E2 towards each other may be selected in such a way that the coupling capacitance C1 between the electrode E1 and the finger 260 becomes greater than the coupling capacitance C2 between the electrode E2 and the finger 260 exactly in the moment when the finger 260 touches the control panel 100.

Until the control panel 100 is touched by the finger 260, the coupling capacitance C2 is greater than the coupling capacitance C1. When the control panel 100 is touched, by the touch the supporting surface of the finger 260 changes, so that also the coupling surface of the fingertip enlarges. The augmentation of the coupling surface at the fingertip 260 causes that the coupling capacitance C1 increases significantly, so that the coupling capacitance C1 becomes greater than the coupling capacitance C2.

This significant rise in the coupling capacitance C1 is, as already described above, detectable by the detection means 200, since the significant rise in the coupling capacitance C1 also leads to a significant rise in the signal S1 shown in FIG. 3, so that the level of the signal S1 becomes greater than the level of the signal S2. This again entails that the switching point S can be unmistakeably identified.

The use of the capacitive switch device according to the invention with two electrodes E1 and E2 behind a control panel 100 has the further advantage that the user of the control panel 100 receives a tactile feedback when switching the switch device.

The switch device according to the invention has the further advantage that several capacitive switch devices may be arranged in close vicinity to each other, in which actuating a switch device may be detected unambiguously by the detection means 200, since each time two signals for a switch device are evaluated by the detection means 200. Thanks to the arrangement according to the invention of the electrodes E1 and E2 towards each other as well as to the corresponding embodiment of the electrode surfaces one effectively avoids that during the approach of a finger to a first switch device the coupling capacitance C1 of a second switch device becomes greater than the coupling capacitance C2 of this second switch device.

Equally the generation of a switching point can be avoided if the finger 260 approaches the switch devices exactly between two switch devices, since in neither switch device the coupling capacitance C1 becomes greater than the coupling capacitance C2.

By means of a corresponding design of the detection means additionally a distance between the two signals S1 and S2 can be determined, from which on an approach or touch of the switch device is to be detected as switching point. Additionally it can be set that a switching point is to be detected as such only if the signal S1 exceeds or falls below the signal S2 by a certain value.

In order for the detection means 200 to distinguish the two signals S1, S2 amplitude-modulated by the modulation devices ZPS1 and ZPS2, it is advantageous if the two modulation devices amplitude-modulate the signals with a different frequency. This will be explained more in detail in the description in connection with FIG. 5.

Figure 5:
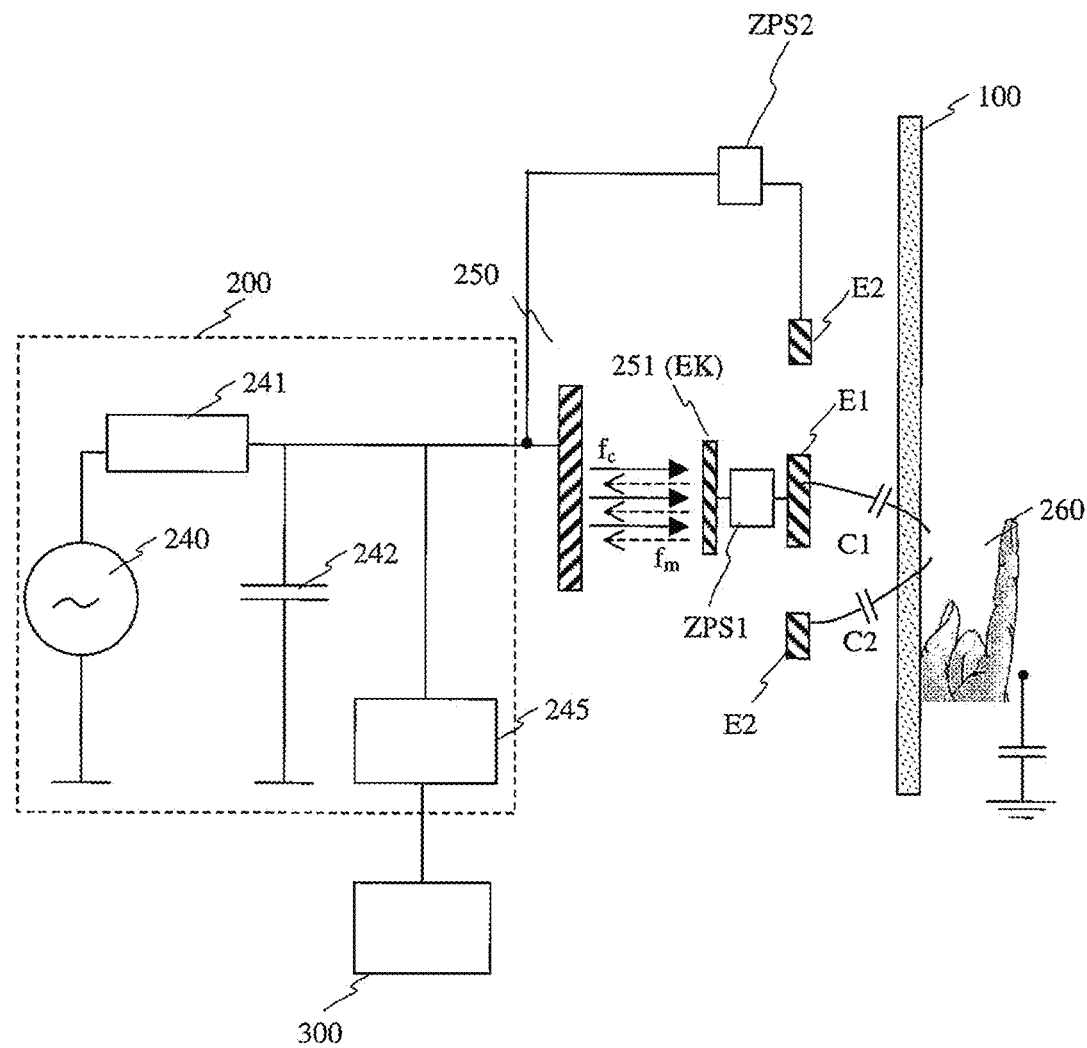
FIG. 5 a possible basic structure of a circuit diagram for a detection means, which is coupled both capacitively and galvanically with the modulation devices.

FIG. 5 shows an embodiment (as equivalent circuit) of a capacitive switch device with a detection means 200 and the switch unit formed by the electrodes and the modulation devices. The switch device is arranged behind a control panel 100.

The detection means 200 substantially consists of a generator 240 and a LC resonant circuit formed by an inductance 241 and a capacitance 242. The LC resonant circuit may be formed as series resonant circuit or as parallel resonance circuit. A transmitting electrode 250 as well as an evaluating device 245 lie in parallel to the LC resonant circuit.

The generator 240 of the server circuit first generates an alternating voltage, which is fed to the LC resonant circuit 241, 242, in order to afterwards generate an electric field with sufficiently large range. The generated electric field fc is emitted at the transmitting electrode 250 and coupled on the electrode 251 (the coupling-in electrode EK of the modulation device ZPS1) of the modulation device ZPS1.

The modulation device ZPS1 is coupled with the electrode E1. The modulation device ZPS2 is coupled with the electrode E2. The structure of the electrode E1 and E2 corresponds here to the structure of the electrodes as shown in FIG. 2.

Unlike the modulation device ZPS1 the modulation device ZPS2 is not capacitively coupled with the detection means 200 but galvanically. The following description refers each time to a capacitive modulation device coupled with the detection means 200. The capacitive coupling has e.g. the advantage, that no cabling between the modulation device and the detection means is necessary.

With the coupling of the electric field, emitted at the transmitting electrode 250, to the coupling-in electrode 251, at the same time also the modulation device ZPS1 is supplied with energy. That can take place e.g. by means of a rectifier.

The arrangement of the transmitting electrode 250 as to the coupling-in electrode 251 is to be chosen in such a way that the electric field emitted by the transmitting electrode may be coupled in to the coupling-in electrode 251.

By means of the coupled electric field fc the load of the detection means 200 is amplitude-modulated by the modulation device ZPS1. This modulation is detectable by the detection means 200.

The modulation of the load done by the modulation device ZPS1 is evaluated by the evaluating device 245.

If, as shown in FIG. 5, a hand or a finger 260 approaches the electrode device E1, E2, this causes that the coupling capacitances C1 and C2 change, so that the level, with which the load of the detection means 200 is amplitude-modulated, changes.

The switch device presents two modulation devices ZPS1 and ZPS2, which in case of an approach of the finger 260 to the electrode device E1, E2 amplitude-modulate the load of the detection means 200. In order to make the modulation by the two modulation devices ZPS1 and ZPS2 distinguishable for the detection means 200, the single modulation devices ZPS1 and ZPS2 are formed in such a way that the detection means 200 may separate the load amplitude-modulated by the respective modulation devices ZPS1 and ZPS2 and accordingly assign it to the single modulation devices.

For this purpose to the modulation devices different measures may be provided.

For example the single modulation devices may provide a free-running oscillator, which is operated each time with a different oscillator frequency (the load is thus amplitude-modulated with different oscillator frequencies), so that to the detection means a frequency mix with different amplitudes is applied, which may be separated accordingly e.g. with the help of a Fourier transformation.

Instead of a free-running oscillator in the modulation devices also a frequency divider may be provided, which divides the frequency of the electric field emitted by the detection means. Preferably the division ratio in the single modulation devices is different, so that the single modulation devices operate each time with different frequencies and amplitude-modulate the load of the detection means each time with different frequencies. Here, too, at the detection means a frequency mix is detected with different amplitudes, which may be separated e.g. with the help of a Fourier transformation accordingly. The division ratio of the respective modulation devices is known to the detection means, so that a precise assignment of a separate signal to a modulation device is guaranteed.

The detection means 200 or the evaluation unit 245 may be coupled with a command unit or device control 300. In one embodiment the evaluation unit provides the level to a switch device.

In an embodiment not shown here several switch units may be coupled to the detection means 200. For the evaluation of the switching state of the several switch devices the detection means need only know the frequencies, with which the modulation devices amplitude-modulate the load of the detection means.

As, for determining a switching condition of a switch device, the modulations of each time two modulation devices are evaluated and compared with each other, several switch devices may be arranged also in close vicinity to each other. If all the switch units are capacitively coupled with the detection means 200, for example a compact control panel may be made available, which need not have connectors for coupling the control panel with the detection means.

FIG. 6a shows another embodiment of a capacitive switch device according to the invention, in which between the electrodes E1 and E2 an additional screen electrode SE is arranged. In this way reciprocal influences of the electrodes E1 and E2 are avoided as far as possible, so that the distance between the electrodes E1 and E2 can be further reduced.

The FIGS. 6b to 6c each show an arrangement of two electrodes E1 and E2 a capacitive switch device, wherein one electrode E2 may be formed by several electrode segments and in which between the two electrodes a screen electrode SE is arranged.

FIG. 6b shows the electrode arrangement shown in FIG. 6a in a top view. The annular screen electrode SE is arranged between the electrodes E1 and E2.

FIG. 6c shows the electrode arrangement from FIG. 6b, in which instead of the electrode E2 two electrode segments E1a and E2b are arranged around the electrode E1 or around the screen electrode SE. In case of approach of a finger to the electrode structure E1, E2a, E2b at first the capacitive coupling between the electrode segments E2a, E2b and the finger is greater than the capacitive coupling between the electrode E1 and the finger. From a certain distance of the finger from the electrode structure E1, E2a, E2b onwards the capacitive coupling between the electrode E1 and the finger is greater than the capacitive coupling between the electrode segments E2a, E2b and the finger.

Depending on the direction from which the finger approaches the electrode structure E1, E2a, E2b, it may happen that the coupling between the electrode E1 and the finger at first becomes greater than the coupling between an electrode segment and the finger. In this way the direction may be determined from which the finger approaches the electrode structure E1, E2a, E2b. The detection means 200 may be designed in various ways as for the generation of a switching level. In one embodiment the switching level can be changed as soon as the capacitive coupling between the electrode E1 and the finger exceeds the capacitive coupling between one of the two electrode segments E2a, E2b and the finger. In another embodiment the switching level can be changed when the capacitive coupling between the electrode E1 and the finger exceeds the capacitive couplings between both electrode segments E2a, E2b and the finger.

The two electrode segments E2a and E2b are each coupled with a modulation device ZPS2a and ZPS2b. The modulation devices ZPS2a and ZPS2b again are coupled (capacitively or galvanically) with the detection means 200. In case of approach of a finger to the electrode structure E2a, E2b, E1 thus three modulation devices ZPS2a, ZPS2b and ZPS1 each provoke a modulation of the load in the detection means 200, as described with reference to FIG. 5.

All three modulation devices modulate the load of the detection means 200 with an amplitude characteristic for the approach or capacitive coupling and with a characteristic frequency for the respective modulation device. The amplitudes frequency mixture is separated into three signals in the detection means 200. The switching point S may then be determined from these three signals.

FIG. 6d shows the electrode arrangement from FIG. 6b, in which instead of the electrode E2 four electrode segments E2a, E2b, E2c and E2d are arranged around the electrode E1 or around the screen electrode SE. The operation corresponds to that described in regard to FIG. 6c.

In further embodiments not shown here three or more than four electrode segments may also be provided. The electrodes may also be other than circular or annular. It is also possible that the electrode E1 is formed by several electrode segments.

Figure 7:
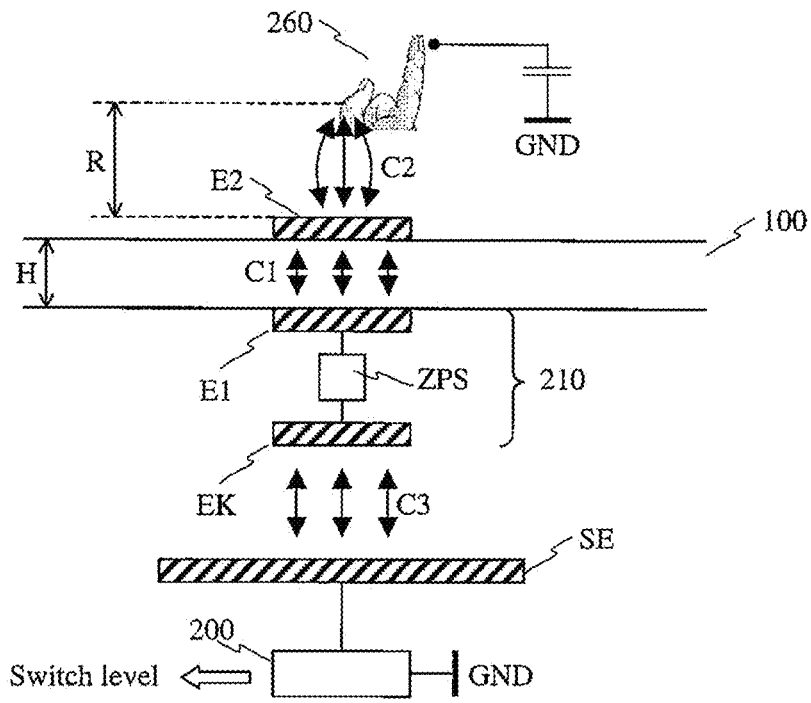
FIG. 7 an embodiment of a capacitive switch device according to the invention.

FIG. 7 shows another embodiment of a capacitive switch device according to the invention, which substantially comprises a switch unit 210 and a detection means 200. The switch unit 210 substantially comprises a modulation device ZPS, a detector electrode E1, an auxiliary electrode E2 and a coupling-in electrode EK. The switch unit 210 is capacitively coupled to a detection means 200.

The structure as well as the operation of the detection means 200 is described in more detail below in regard to FIG. 9.

The switch device is arranged substantially behind a control panel 100. By means of the coupling-in electrode EK the switch unit 210 is capacitively coupled with the detection means 200, wherein the detection means 200 radiates an electrical alternating field at a transmission electrode SE, which field is coupled into the coupling-in electrode EK. By the coupled alternating electric field the switch device is contemporaneously supplied with energy.

If a finger 260 approaches the top surface of the control panel 100, at which no auxiliary electrode E2 is arranged, a part of the electric field applied at the detector electrode E1 is absorbed by the human body. In case of increasing approach of the finger 260 to the detector electrode E1, the coupling capacitance formed by the finger 260 and the detector electrode E1 increases.

The change of this coupling capacitance causes that the modulation device ZPS modulates an electric variable of the switch unit 210 or of the modulation device ZPS, which causes again a modulation of the load on the detection means 200. The modulation of the load is detected by the detection means 200.

As the switch unit 210 is substantially arranged behind the control panel 100 which possesses the thickness H, the finger 260 may approach the switch unit 210 maximally with the distance H. A signal curve corresponding to this approach, which is calculated or determined by the detection means 200, is shown in the upper chart of FIG. 8. As can be seen in the upper chart of FIG. 8, the signal level rises in case of increasing approach of the finger to the control panel, in which when touching the control panel (with the distance H between the finger 260 and the detector electrode E1) the switching level S is reached, in case of which a switching process may be initiated, for example for a household appliance.

Figure 8:
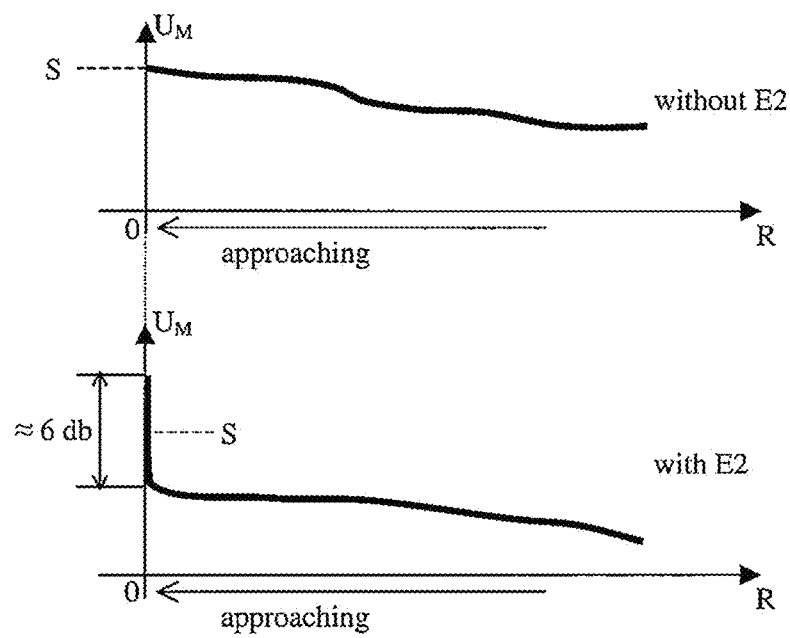
FIG. 8 the course of two signal levels, one without an auxiliary electrode and one with an auxiliary electrode.

In the upper chart the FIG. 8 it can also be seen that the signal curve in case of increasing approach of the finger 260 to the control panel 100 is subject to certain fluctuations. These fluctuations result from the fluctuations of the capacitive coupling or earthing conditions of the operator. These fluctuations of the capacitive coupling or earthing conditions of the operator can entail that even when touching the control panel 100 the switching threshold S is not reached.

In order to ensure that the switching threshold S is reached in any case, on the top surface of the control panel 100 oriented towards the operator an auxiliary electrode E2 is arranged. This auxiliary electrode E2 has a constant coupling C1 to the detector electrode E1 of the switch unit 210 arranged behind the control panel 100.

Between the finger 260 and the auxiliary electrode E2 a coupling capacitance C2 is formed. The coupling capacitances C1 and C2 jointly form a total capacitance (C1, C2) between the finger 260 and the detector electrode E1 (serial connection of the coupling capacitances C1 and C2).

During the approach of the finger 260 to the auxiliary electrode E2 the capacitive coupling C2 between the finger 260 and the auxiliary electrode E2 changes. This change of the capacitive coupling C2 acts also on the total capacitance (C1, C2) between the finger 260 and the detector electrode E1. The change of the total capacitance (C1, C2) between the finger 260 and the detector electrode E1 entails that the modulation device ZPS modulates an electric variable of the modulation device, which leads to a modulation of the load of the detection means 200.

During the approach of the finger 260 to the auxiliary electrode E2 the signal curve which is calculated or determined by the detection means is similar to the signal curve without auxiliary electrode E2. Unlike the switch device without auxiliary electrode E2, the approach to the switch unit 210 is not limited to a predetermined distance H, so that the finger 260 can touch the switch device (in this case the auxiliary electrode E2).

Touching the auxiliary electrode E2 leads to an abrupt rise in the total capacitance (C1, C2) between the finger 260 and the detector electrode E1, since the total capacitance (C1, C2) abruptly approaches the coupling capacitance C1. This results from the prescription (C1·C2)/(C1+C2) for two capacitors in series, in which with increasing approach of the finger 260 to the auxiliary electrode E2 the coupling capacitance C2 rises strongly if compared to the constant remaining coupling capacitance C1, which in case of touch finally causes that the total capacitance (C1, C2) almost corresponds to the coupling capacitance C1. In the equivalent circuit this would correspond to a coupling capacitance C1 with a very small resistance in series. This abrupt rise in the capacitive coupling C1 leads to an abrupt rise in the signal calculated or detected by the detection means.

An example for a signal curve calculated or detected by the detection means 200 for an approach with following touch is visualized in the lower chart of FIG. 8. The signal curves shown in FIG. 8 correspond to the load of a detection means which was amplitude-modulated by the modulation device ZPS. The touch of the auxiliary electrode E2 by the finger 260 leads to an abrupt rise in the modulation amplitude by roughly 6 dB. This rise is in any case sufficient for the switching level S being exceeded with certainty.

Additionally, based on the abrupt rise in the signal level, an approach of the finger to the auxiliary electrode E2 can be reliably distinguished from the touch of the auxiliary electrode E2 by the finger. On the other hand a removal of the finger 260 from the auxiliary electrode E2 can also be reliably detected, since a removal of the finger leads to an abrupt drop of the signal level.

Another advantage of the capacitive switch device according to the invention consists of the fact that, besides the precise detection of the touch of a user interface, a switching process assigned to the switch device is always matched with a tactile feedback (touch) of the user.

Another advantage can be seen in the fact that thanks to the reliable distinction between an approach and a touch for example two stage switching actions may be triggered, for example in case of triggering a digital camera.

Figure 9:
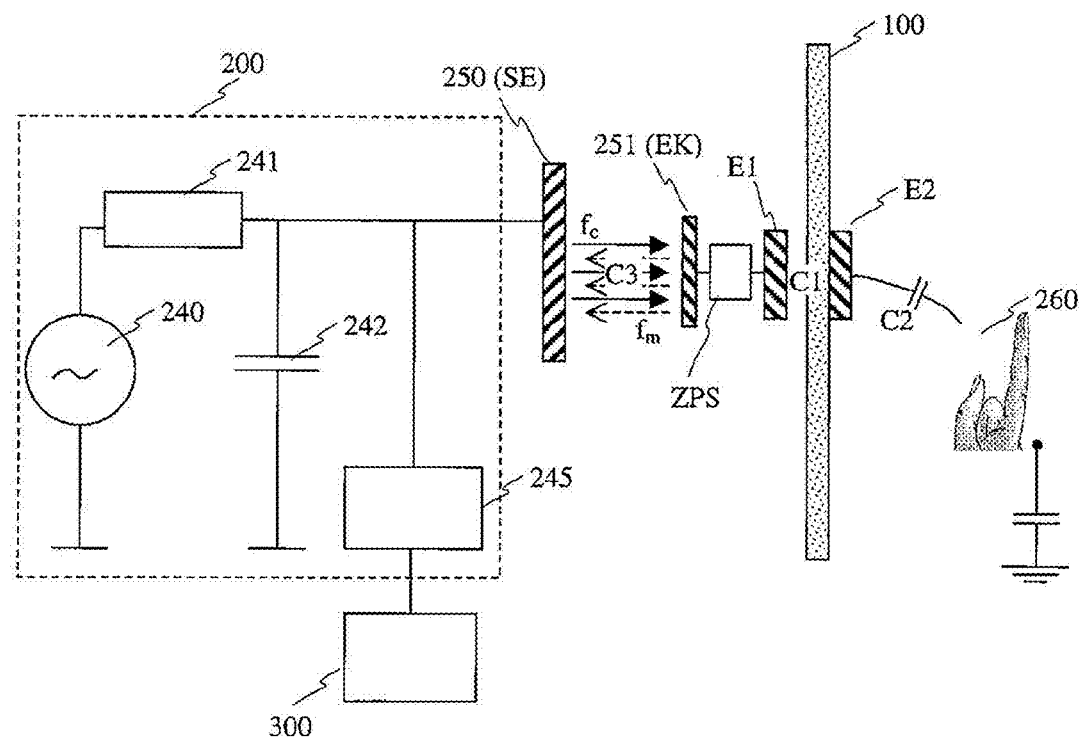
FIG. 9 a possible basic structure of a detection means, to which a capacitive switch unit is capacitively coupled.

FIG. 9 shows a possible embodiment of a detection means 200, to which a switch unit is capacitively coupled. A part of the switch device is arranged behind a control panel 100.

The detection means 200 substantially corresponds to the detection means 200 from FIG. 5 and substantially consists of a generator 240 and a LC resonant circuit formed by an inductance 241 and a capacitance 242. The LC resonant circuit may be formed as series resonant circuit or as parallel resonant circuit. In parallel to the LC resonant circuit there are a transmitting electrode 250 (in FIG. 1 indicated by SE) as well as an evaluating device 245.

The generator 240 of the detection means 200 first generates an alternating voltage, which is fed to the LC resonant circuit 241, 242, in order to afterwards generate an electric field with sufficiently large range. The generated electric field fc is emitted at the transmitting electrode 250 and coupled into the coupling-in electrode 251, which is coupled with the modulation device ZPS.

The modulation device ZPS is coupled with a detector electrode E1.

In another embodiment the modulation device ZPS may also be galvanically coupled with the detection means 200. The capacitive coupling has however the advantage that no cabling between the modulation device ZPS and the detection means 200 is necessary.

With the coupling of the electric field emitted at the transmitting electrode 250 into the coupling-in electrode 251 at the same time also the modulation device ZPS is supplied with energy. This may take place e.g. by means of a rectifier circuit.

The arrangement of the transmitting electrode 250 as to the coupling-in electrode 251 is to be chosen in such a way that the electric field fc emitted by the transmitting electrode may be coupled to the coupling-in electrode 251 and that the capacitive coupling is big enough to sufficiently supply the modulation device with energy.

By means of the coupled electric field fc the load of the detection means 200 is amplitude-modulated by the modulation device ZPS. This modulation of the load is detectable by the detection means 200. The modulation of the load by the modulation device ZPS is evaluated by the evaluating device 245. At the top surface oriented towards the operator of the control panel 100 an auxiliary electrode E2 is arranged. The arrangement at the top surface is selected in such a way that between the detector electrode E1 and the auxiliary electrode E2 a capacitive coupling with a coupling capacitance C1 arises. If, as shown in FIG. 9, a hand or a finger 260 approaches the auxiliary electrode E2, this entails that the total capacitance (C1, C2) between the finger and the detector electrode E1, due to the varying capacitive coupling C2 between the finger 260 and the auxiliary electrode E2, changes. The change of the total capacitance (C1, C2) causes that the level, with which the load of the detection means 200 is amplitude-modulated, changes.

To a detection means 200 several switch devices may be capacitively coupled, in which every switch device, or the modulation devices of the switch devices, in case of approach or touch amplitude-modulates the load of the detection means accordingly. In order to make the load modulation of several modulation devices distinguishable for the detection means 200, those measures may be provided at the modulation devices, which have already been described in regard to FIG. 5, i.e. the use of a free-running oscillator or a divider, in order to amplitude-modulate the load of the detection means each time with different frequencies. The frequency mix with different amplitudes detected at the detection means can be separated e.g. with the help of a Fourier transformation accordingly.

The detection means 200 or the evaluation unit 245 may be coupled with a command unit or device control 300. In one embodiment the evaluation unit 245 at several exits can make available each time one level to a switch device.

Figure 10:
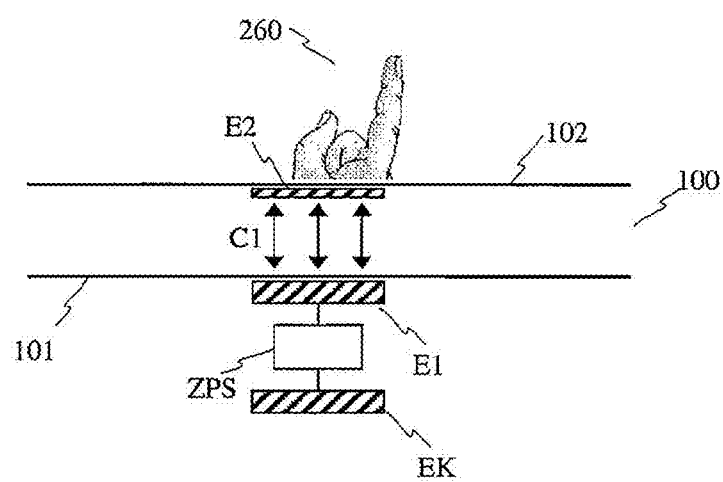
FIG. 10 another embodiment of the switch device according to the invention with an alternative arrangement of the auxiliary electrode.

FIG. 10 shows an alternative embodiment of a switch device according to the invention. In this embodiment the auxiliary electrode E2 is not arranged on the surface 102 of a control panel 100, but directly (for example 0.5 mm) below the surface 102. This has the advantage that the auxiliary electrode E2 is protected from outside influences, for example dirt. Nevertheless the reaching of a switching level S as well as the distinction of an approach from a touch can be ensured.

Thanks to the arrangement of the auxiliary electrode E2 directly below the surface 102 of the control panel 100 the distance up to which the finger 260 can approach the switch device is minimized. The capacitive coupling C2 between the auxiliary electrode E2 and the finger 260 increases in case of increasing approach of the finger to the auxiliary electrode E2. A signal curve determined or calculated by the detection means for the approach of the finger to the auxiliary electrode E2 substantially corresponds to the signal curve as shown in FIG. 8 in the upper chart.

When the surface 102 of the control panel 100 is touched by the finger, the supporting surface of the fingertip on the surface 102 of the control panel increases abruptly. The augmentation of this supporting surface leads again to an abrupt rise in the capacitive coupling between the auxiliary electrode E2 and the finger 260. The signal curve determined or calculated by the detection means 200 for this purpose substantially corresponds to the signal curve as it is shown in the lower chart of FIG. 8. The signal rise when touching the surface 102 is admittedly not as big as when directly touching the auxiliary electrode E2 with the finger 260, the rise is however sufficient in order to exceed a predetermined switching level S with certainty. Moreover the signal rise is sufficient in order to distinguish the approach of a finger to the auxiliary electrode E2 from the touch of the surface 102 by the finger with certainty.

In an embodiment not shown here, the surface 102 itself may be formed partially electrically conductive. Preferably those areas of the control panel 100 are electrically conductive, at the back side of which the switch units 210 are arranged or are to be arranged.

The capacitive coupling C3 of the switch units 210 with the detection means 200 has moreover the advantage that the creative leeway for the arrangement of switch units behind a control panel is increased, since no galvanic connections between the switch units and the detection means are necessary. Moreover the control panels, for example for a household appliance with different types as for its functionality, may be produced uniformly, which significantly simplifies production and considerably reduces production costs. In order to design the control panel as for the functionality of the corresponding appliance only the switch units 210 necessary for this purpose have to be arranged.

On the user surface 102 for example a foil may be applied, which in the areas, in which at the back side of the control panel 100 the switch units 210 are situated, are electrically conductive. In this way it becomes also possible to provide a control panel 100 with all the switch units, wherein the activation of the single switch units is reached by applying a partially electrically conductive foil on the user surface 100 of the control panel. In this way just those switch units are activated, in which the corresponding area of the foil is electrically conductive. The remaining switch units may be deactivated, as touching the control panel in the area of these switch units does not lead to an abrupt rise in the signal calculated or detected by the detection means 200.

Additionally for not having to provide a switching level for deactivated switch units, the detection of an exceeded switching level S may be combined with the evaluation of an abrupt rise in the signal curve, in that exceeding a predetermined threshold value is interpreted as a switching signal only if the exceeding the threshold value was caused by an abrupt rise in the signal curve.

As the capacitive switch units 210 are supplied with energy by the electric alternating field provided by the detection means 200, moreover whole control panels may be provided including the switch units, which need not have additional electric connectors, so that by simply exchanging a control panel the functionality of an instrument may be changed.

Figure 11:
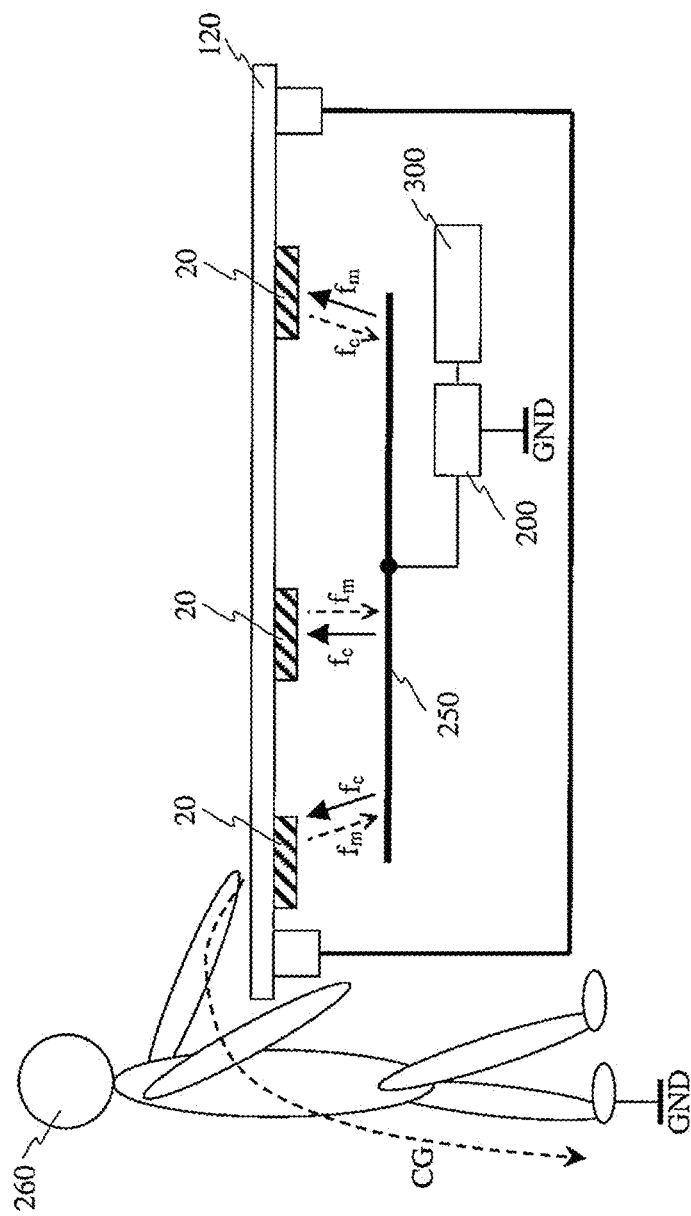
FIG. 11 a glass ceramic cooktop with a capacitive switch device according to the invention.

FIG. 11 shows a possible embodiment of a switch device for a cooktop 120, wherein the control elements, which serve for operating the cooktop, are arranged at the bottom 121 of the cooktop 120.

The structure of the control elements 20 is described in more detail in regard to the following FIGS. 2, 3a and 3b. The control elements 20 are capacitively coupled to a receiving device 200. The receiving device 200 substantially corresponds to the detection means described above. The capacitive coupling of the control elements 20 with the receiving device 200 or detection means is done by means of an electrode device 250, the so-called server electrode, wherein the server electrode 250 is coupled with the receiving device 200, and at the server electrode 250 an electrical alternating field generated by the receiving device or detection means is emitted. The emitted alternating field fc is coupled to a first electrode 251 not shown in detail in FIG. 11, the so-called coupling-in electrode of the control element 20. This alternating electric field coupled to the reception electrode 251 serves at the same time to supply the control elements 20 with energy. This may be carried out for example by means of a rectifying device in the control element 20.

A control element 20 presents a second electrode not shown in detail in FIG. 11, the so-called detector electrode E1. This detector electrode is coupled with earth with a certain capacitance CG. The approach for example of an operator's finger to the detector electrode E1 causes a change of the capacitive coupling CG of the detector electrode to earth, since a part of the electric field emitted at the detector electrode is absorbed by the operator's body 260.

The change of this coupling capacitance CG causes, that a modulation device of the control element 20 not shown in detail in FIG. 11 amplitude-modulates an electric variable of the control element 20, which leads to a change of the load of the receiving device 200. This load modulation is detected by the receiving device 200, so that the receiving device 200 may execute or provide a corresponding function assigned to the control element 20 at the cooktop.

The receiving device 200 may forward corresponding switching signals of the respective control elements 20 also to the control electronics 300 of the cooktop 120.

In order to ensure an impeccable function of the control elements 20, it is necessary to bring the alternating field emitted at the server electrode 250 fc accordingly near the control elements 20, so that the emitted electric alternating field fc may be coupled into the coupling-in electrodes 251 of the control elements 20 accordingly. As server electrode 250 for this purpose the conductive structures arranged below the glass ceramic cooktop 120 may be used, for example heat shielding plates or supporting wedges. Alternatively simple conductive surfaces or structures, that are coupled with the receiving device 200 by a monopolar wire connection, may be used in order to bring the alternating electric field fc into the proximity of the control elements 20.

The capacitive coupling of the control elements 20 to the receiving device 200, as well as the use of already present conductive structures at the bottom of the glass ceramic cooktop 120 have the advantage that the printed circuits assigned to the control element 20 as well as their coupling to the control elements 20 may be completely omitted. Another advantage consists of the fact that the control elements 20 may be arranged in any position below the glass ceramic cooktop 120.

It is particularly advantageous that the arrangement and the number of the control elements only influence the mechanical structure of the glass ceramic cooktop, not however the structure of the basement of the glass ceramic cooktop nor that of the control electronics 300 of a glass-ceramic stove. The receiving device 200 moreover with low additional cost may be integrated into the control electronics 300 of the instrument. Thus for example the microcontroller provided for the stove control in a simple way may be extended by the functionality of the receiving device 200.

As the control elements 20 can be supplied with energy by means of the alternating electric field fc, for the control elements 20 need not be provided any additional or external power supply. With an adequate design of the receiving device 200, for the extension of the functionality of a cooktop only additional control elements 20 need be arranged at the bottom of the cooktop. The adaptation of the functionality as for further control elements 20 is done exclusively in the receiving device 200 or in the control electronics 300 of the cooktop. The base of the cooktop can remain unchanged.

Figure 12:
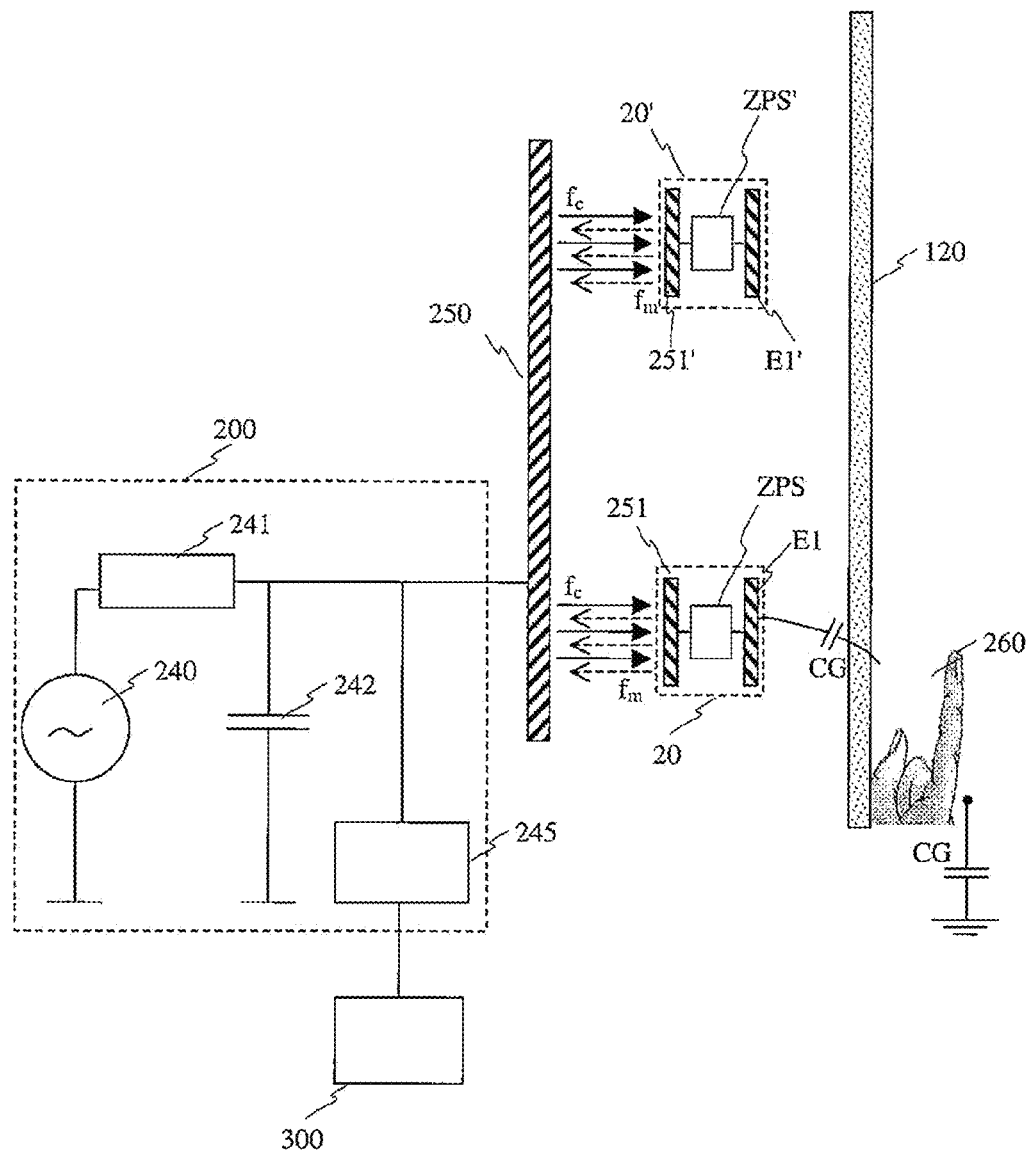
FIG. 12 a possible circuit diagram as equivalent circuit with a receiving device and at least one control element, in which the at least one control element is capacitively coupled to the receiving device.

FIG. 12 shows an embodiment (as an equivalent circuit) of a capacitive switch device with two control elements 20, 20' and a receiving device 200, to which the control elements 20, 20' are capacitively coupled. The capacitive switch device is arranged behind the glass ceramic plate 120 of a cooktop. The receiving device 200 substantially consists of a generator 240 and a LC resonant circuit formed by an inductance 241 and a capacitance 242. The LC resonant circuit may be formed as series resonant circuit or as parallel resonant circuit. In parallel to the LC resonant circuit there is an electrode device 250, which is operated as transmitting electrode, as well as an evaluating device 245. The transmitting electrode 250 is formed by the electrically conductive structures arranged behind the glass-ceramic field and belonging to the glass-ceramic field.

The generator 240 of the receiving device 200 generates an alternating voltage with which a LC resonant circuit 241, 242 is excited. The LC resonant circuit generates an electrical alternating field with sufficiently large range. The alternating electric field fc is emitted at the transmitting electrode 250 and coupled into the coupling-in electrode 251 of the control elements 20, 20'.

The control elements 20 are each time formed by a coupling-in electrode 251, 251', a detector electrode E1; E1' and a modulation device ZPS, ZPS'.

With the coupling of the alternating electric field emitted at the transmitting electrode 250 fc into the coupling-in electrodes 251, at the same time also the modulation devices ZPS, ZPS' are supplied with energy. This may take place e.g. by means of a rectifier circuit.

The arrangement of the transmitting electrode 250 as to the coupling-in electrodes 251 is selected in such a way that the alternating electric field fc emitted by the transmitting electrode 250 may be coupled at the coupling-in electrodes 251, 251' and that the capacitive coupling is big enough to supply the modulation devices ZPS, ZPS' sufficiently with energy.

By the coupled alternating electric field fc the load of the receiving device 200 is amplitude-modulated by the modulation devices ZPS, ZPS'. This modulation of the load is detectable by the receiving device 200.

The modulation of the load done by the modulation devices ZPS, ZPS' is evaluated by the evaluating device 245.

If, as shown in FIG. 12, a hand or a finger 260 approaches the surface in the area of the glass-ceramic field 120, in which at the back side there is a control element, this causes that the coupling capacitance CG formed by the finger 260 and the detector electrode E1 changes with increasing approach. The change of the coupling capacitance CG causes that the level with which the load of the receiving device 200 is amplitude-modulated changes. Preferably the level of the amplitude increases in doing so.

Several control elements may be capacitively coupled to a receiving device 200, wherein every control element (or the corresponding modulation devices) in case of approach or touch accordingly amplitude-modulates the load of the receiving device 200.

In order to make the load modulation, which is caused by several modulation devices, distinguishable for the receiving device 200, the single modulation devices are formed in such a way that the receiving device 200 may separately detect the load amplitude-modulated by the respective modulation devices and accordingly can assign it to the single modulation devices.

For this purpose at the modulation devices different measures may be provided.

For example the single modulation devices may provide a free-running oscillator, which each time is operated with a different oscillator frequency (the load is thus each time amplitude-modulated with an oscillator frequency), so that to the receiving device 200 a mixture of frequencies with each time different amplitudes is applied, which may be separated e.g. with the help of a Fourier transformation (e.g. FFT) accordingly.

Instead of a free-running oscillator in the modulation devices also a frequency divider may be provided, which divides the frequency of the alternating electric field emitted by the receiving device 200 according to a preset division ratio. Preferably the division ratio in the single modulation devices is different, so that the single modulation devices amplitude-modulate the load of the receiving device 200 each with different frequencies. Here too at the receiving device 200 a mixture of frequencies with each time different amplitudes is detected, which may be separated e.g. with the help of a Fourier transformation. The division ratio of the respective modulation devices is known to the receiving device, so that a precise assignment of a separate signal to a modulation device is guaranteed.

The receiving device 200 or the evaluation unit 245 may be coupled with a command unit or device control 300. In one embodiment the evaluation unit 245 at several exits can make available each time one switching level (e.g. a high or low level) of a switch device.

Figure 13A:
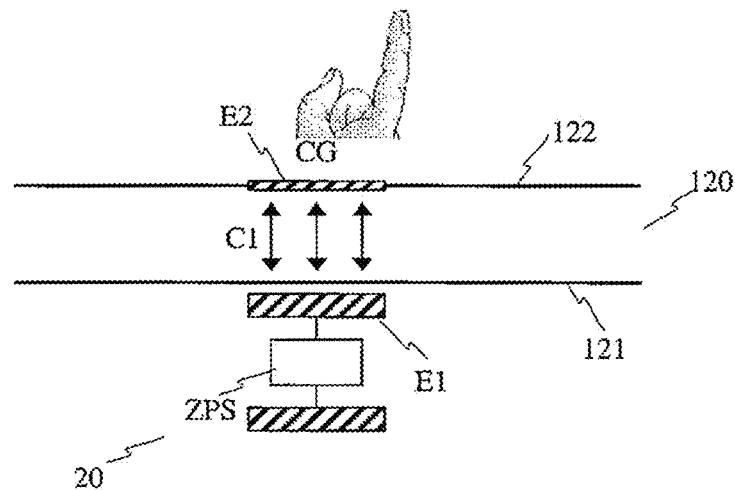
FIG. 13a an embodiment of a detector electrode of a control element of a capacitive switch device according to the invention.

FIG. 13a shows an embodiment for a detector electrode E1 with an additional auxiliary electrode E2. The control element 20 is arranged at the bottom 121 of the cooktop 120 in such a way that the detector electrode E1 is placed directly at the bottom 121 of the cooktop. Since the cooktop 120 has a certain thickness, this causes that an operator's finger approaching the control element 260 cannot touch the detector electrode E1, but can only approach it up to a certain distance (which corresponds to the thickness of the cooktop 120). Environmental influences or fluctuations in the coupling capacitance between the detector electrode E1 to earth over the operator's body can entail that for example the electric field emitted at the detector electrode E1 is not sufficiently absorbed, so that perhaps the switching functionality assigned to the control element 20 is not triggered.

This is prevented by providing, on the surface 122 of the cooktop 120, a conductive structure E2, which is arranged substantially in the area of the cooktop 120, at the back side 121 of which the control elements 20 are situated. This additional conductive structure, the so-called auxiliary electrode E2, is coupled with the detector electrode E1 with a predetermined coupling capacitance C1. The detector electrode E1 thus makes possible the precise detection of a switching point.

Between the finger 260 and the auxiliary electrode E2 a coupling capacitance CG is formed. In the equivalent circuit the coupling capacitances C1 and CG correspond to two capacitors in series with the capacitance C1 and with a capacitance CG that rises with increasing approach of the finger. Between the finger 260 and the detector electrode E1 thus a total capacitance is built up, formed by the coupling capacitances C1 and CG.

The change of the coupling capacitance CG by an approaching finger causes that also the total capacitance between the finger 260 and the detector electrode E1 changes. The change of the total capacitance in turn causes that the modulation device ZPS of the control element 20 amplitude-modulates an electric variable of the control element 20, which leads to a change of the load of the receiving device 200. Touching the auxiliary electrode E2 with the finger 260 causes that the total capacitance between the finger and the detector electrode E1 abruptly rises and substantially corresponds to the coupling capacitance C1.

This abrupt rise in the total capacitance may be detected by the receiving device 200, so that a definite switching point may be determined.

With the additional auxiliary electrode E2 a functionality may be provided, in which for example a distinction must be made between the approach of a finger and the touch.

Figure 13B:
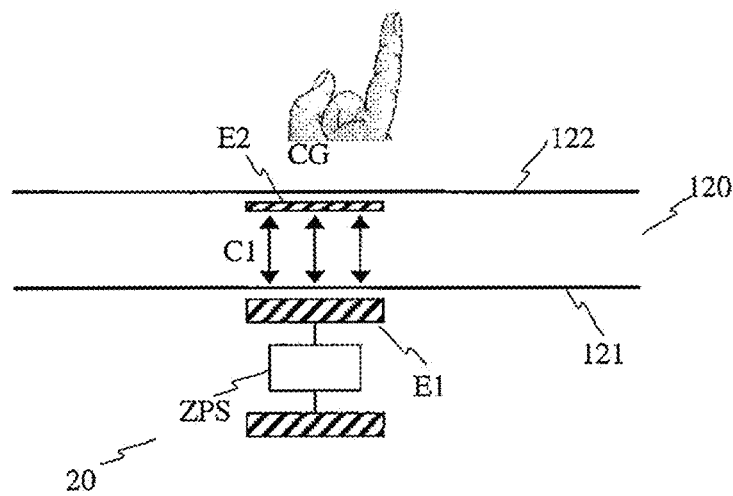
FIG. 13b another embodiment of a detector electrode of a control element of a capacitive switch device according to the invention.

In FIG. 13b an alternative design to FIG. 13a is shown, in which the additional auxiliary electrode E2 is arranged directly below the surface 122 of the cooktop 120. In this way the auxiliary electrode E2 is effectively protected against environmental influences and destruction. Nevertheless the advantage of this arrangement is that the receiving device 200 may detect a precise switching point.

When touching the surface 122 with the finger 260, the distance between the fingertip of the finger 260 and the auxiliary electrode E2 is very small. Because of the arrangement of the auxiliary electrode E2 directly under the surface 122 of the glass ceramic cooktop, also here in the receiving device 200 a jump of the signal level may be detected, since when touching the surface 122 with the finger 260 the fingertip enlarges, which leads to an abrupt rise in the capacitive coupling CG between the auxiliary electrode E2 and the finger 260. The total capacitance between the finger and the detector electrode E1 also rises abruptly if the coupling capacitance C1 is sized accordingly. Like in the embodiment according to FIG. 13a this abrupt rise in the total capacitance between the finger and the detector electrode E1 may be detected precisely by the receiving device 200 and be precisely assigned to a switching level.

The auxiliary electrodes E2 shown in FIGS. 13a and 3b may be realized for example by means of conductive structures which are components of the glass ceramic cooktop 120. For example the auxiliary electrodes E2 also through vapor plating of conductive structures may be realized on the surface 122 of the glass ceramic cooktop.

If the receiving device 200 is formed in such a way that it detects an actuation of a control element 20 by an abrupt rise in the signal level assigned to the control element 20, for example glass ceramic plates 120 for glass-ceramic cooktops may be provided at the bottom side of which 121 all necessary control elements 20 for all model variants are arranged. The activation of one or more control elements, and thus the definition of a model variant, can take place by applying the corresponding auxiliary electrodes E2, for example during the production of the glass ceramic plate for the glass-ceramic cooktop. For those control elements 20, to which no auxiliary electrode E2 is assigned, the receiving device 200 may detect no abrupt rise in a total capacitance.

Alternatively, the receiving device 200 may be formed in such a way that after the mounting process of the glass ceramic cooktop a single initialization step is carried out, in case of which all auxiliary electrodes E2 arranged on the surface 122 are touched, in order to allow in such a way a definition of the active control elements by the receiving device 200. This definition of the active control elements 20 can take place by evaluating an abrupt rise in the total coupling by the receiving device 200.

Of course the capacitive switch device proposed here may also be used for operating other devices, especially for household utensils, using conductive structures belonging to the device arranged at the back side of a control panel, in order to form the server electrode 250 of a receiving device.

The invention claimed is:

1. A device for touch/proximity detection, comprising
   a detection unit comprising a generator outputting a signal for generating an electric field,
   an electrode structure having at least one detector electrode and at least one auxiliary electrode arranged at a predetermined distance from the detector electrode, and
   a first modulator coupled between the at least one detector electrode and the generator and receiving said signal, wherein the first modulator modulates the signal depending on a capacitive coupling of said detector electrode and an approaching object,
   a second modulator coupled between the at least one auxiliary electrode and the generator and receiving said signal, wherein the second modulator modulates the signal depending on a capacitive coupling of said auxiliary electrode and the approaching object; and
   wherein the detection unit further comprises a detector for detecting a change of the modulation generated by said first and second modulator.

2. The device according to claim 1, wherein the detector being configured to detect indicative signals for capacitive couplings between the electrodes and the object, and the areas of the detector electrode and the auxiliary electrode as well as the arrangement of the detector electrode and the auxiliary electrode relative to each other are selected such that in case of an approach of the object to the electrode structure up to a predetermined distance a quotient between a second capacitive coupling between the auxiliary electrode and the object and a first capacitive coupling between the detector electrode and the object is greater than 1.

3. The device according to claim 1, wherein the second modulator modulates the signal depending on a capacitive coupling of said auxiliary electrode and an approaching object, wherein the second modulation device is capacitively coupled with the detection unit.

4. The device according to claim 1, wherein the detector electrode is substantially circular and the auxiliary electrode is substantially annular and arranged around the detector electrode.

5. The device according to claim 1, wherein a shield electrode is arranged between the detector electrode and the auxiliary electrode.

6. The device according to claim 1, wherein the auxiliary electrode comprises at least two electrode segments each coupleable with an associated modulation device and each being capacitively coupleable with the detection unit.

7. The device according to claim 1, wherein the detector electrode and the auxiliary electrode can be brought into capacitive coupling with each other with a predetermined first coupling capacitance, between the auxiliary electrode and the object a second coupling capacitance being formed that undergoes a change in case of an approach of the object to the auxiliary electrode and/or at a touch of the auxiliary electrode by the object, the first coupling capacitance and the second coupling capacitance forming a total capacitance between the detector electrode and the object.

8. The device according to claim 1, wherein the detection unit is configured to detect the total capacitance between the detector electrode and the object.

9. The device according to claim 1, wherein the auxiliary electrode being arranged substantially in parallel to and at a predetermined spacing from the detector electrode.

10. The device according to claim 1, wherein a touch of the auxiliary electrode by the object causes an abrupt rise in a total capacitance between the detector electrode and the object.

11. The device according to claim 2, wherein each of the first and second modulators has one input coupling electrode and wherein a capacitive coupling of the detection means with the first and second modulator is created by said signal which is fed to the input coupling electrodes.

12. The device according to claim 11, wherein the first and/or second modulator is supplied with energy with the alternating electric field.

13. The device according to claim 3, wherein the first modulator is coupled with the detection unit by a galvanic coupling.

14. The device according to claim 3, wherein each of the first and second modulators comprises one oscillation circuit and one frequency divider.

15. The device according to claim 3, wherein each of the first and second modulators is adapted to create an amplitude modulation indicative of the respective modulation device and of the electric variable with a predetermined frequency.

16. The device according to claim 2, wherein the detection unit comprises:
an electric circuit for generating an electric field and coupleable to coupling electrodes of the device for touch/proximity detection, and
means for evaluating an electric variable by detection of a load change in the electric circuit.

17. The device according to claim 16, wherein the load change is effected at different frequencies by said first and second modulators, the means for evaluating are operable to detect the load change at different frequencies, the detection unit further comprising means for generating a switching signal.

18. The device according to claim 17, further comprising means for frequency analysis, the means for generating a switching signal being configured such that a level change of the switching signal takes place when a direct component caused by the first modulator exceeds or falls below a direct component caused by the second modulator.

19. The device according to claim 16, wherein the electric circuit comprises:
an LC resonant circuit with a signal generating circuit and having a high-quality factor for generating the electric field; and
a transmitting electrode connected in parallel to the LC resonant circuit, a capacitance of the transmitting electrode constituting a part of the resonant circuit capacitance, the electric field generated by the LC resonant circuit being emittable by the transmitting electrode.

20. The device according to claim 18, wherein the direct components of the amplitudes of the separate parts correspond to the capacitive couplings between the electrodes of the device and the object.

21. An operating panel comprising at least one device for touch/proximity detection, the device comprising:
a detection unit comprising a generator outputting a signal for generating an electric field,
an electrode structure having at least one detector electrode and at least one auxiliary electrode arranged at a predetermined distance from the detector electrode, and
a first modulator coupled between the at least one detector electrode and said generator and receiving said signal, wherein the first modulator modulates the signal depending on a capacitive coupling of said detector electrode and an approaching object,
a second modulator coupled between the at least one auxiliary electrode and said generator and receiving said signal, wherein the second modulator modulates the signal depending on a capacitive coupling of said auxiliary electrode and the approaching object; and
wherein the detection unit further comprises a detector for detecting a change of the amplitude modulation generated by said first and second modulators,
wherein the auxiliary electrode is arranged at the user side of the operating panel and the detector electrode at the back side of the operating panel.

22. The operating panel according to claim 21, wherein an arrangement of the auxiliary electrode and the detector electrode relative to each other is selected such that the detector electrode and the auxiliary electrode form a capacitive coupling with a predetermined coupling capacitance.

* * * * *